United States Patent
Liu et al.

(10) Patent No.: US 8,373,272 B2
(45) Date of Patent: Feb. 12, 2013

(54) DEVICE UNDER BONDING PAD USING SINGLE METALLIZATION

(75) Inventors: Chi Kang Liu, Shanghai (CN); Talee Yu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 312 days.

(21) Appl. No.: 12/582,690

(22) Filed: Oct. 20, 2009

(65) Prior Publication Data

US 2011/0037177 A1 Feb. 17, 2011

(30) Foreign Application Priority Data

Aug. 13, 2009 (CN) .......................... 2009 1 0056526

(51) Int. Cl.
*H01L 23/48* (2006.01)
(52) U.S. Cl. .......... 257/758; 257/E23.142; 257/E23.145
(58) Field of Classification Search .................. 257/758, 257/E23.142, E23.145
See application file for complete search history.

(56) References Cited

U.S. PATENT DOCUMENTS

| 5,751,065 | A | | 5/1998 | Chittipeddi et al. | |
|---|---|---|---|---|---|
| 5,984,162 | A | * | 11/1999 | Hortaleza et al. | 228/110.1 |
| 6,107,179 | A | * | 8/2000 | Zomorrodi et al. | 438/612 |
| 6,566,736 | B1 | * | 5/2003 | Ogawa et al. | 257/620 |
| 7,304,385 | B2 | * | 12/2007 | Wang et al. | 257/758 |
| 2002/0000668 | A1 | * | 1/2002 | Sakihama et al. | 257/758 |
| 2004/0182915 | A1 | * | 9/2004 | Bachman et al. | 228/220 |
| 2004/0201098 | A1 | * | 10/2004 | Corrigan | 257/758 |
| 2005/0042853 | A1 | * | 2/2005 | Gasner et al. | 438/612 |
| 2005/0074918 | A1 | * | 4/2005 | Lee et al. | 438/100 |

* cited by examiner

*Primary Examiner* — Trung Q Dang
(74) *Attorney, Agent, or Firm* — Kilpatrick Townsend & Stockton LLP

(57) ABSTRACT

An integrated circuit device comprising an improved bonding pad structure. The device has a semiconductor substrate. A plurality of active MOS devices are formed on the semiconductor substrate. The device has an interlayer dielectric layer overlying the plurality of active MOS devices and at least one single metal bonding pad formed on the interlayer dielectric layer and directly over at least one of the active devices. At least four edge regions are formed on a square shape of the at least one single metal bonding pad. An angled cut region is formed on each of the four edge regions. The device has a buffer metal layer free region located between the plurality of active MOS devices and the at least one single metal bonding pad. The buffer metal layer free region does not have a buffer metal layer in the interlayer dielectric layer.

18 Claims, 5 Drawing Sheets

DEVICE UNDER BONDING PAD USING SINGLE METALLIZATION

CROSS-REFERENCE TO RELATED APPLICATIONS

This application claims priority to Chinese Patent Application No. 200910056526.0 filed Aug. 13, 2009, commonly assigned and hereby incorporated by reference for all purposes.

BACKGROUND OF THE INVENTION

The present invention is directed to integrated circuits and their processing for the manufacture of semiconductor devices. More particularly, the invention provides a method and structures for manufacturing bonding pad structures for advanced integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of bonding pad structures of integrated circuit devices. Such bonding pad structure has traditionally became smaller and smaller and occupy a smaller region of silicon real estate. Although there have been significant improvements, such bond pad designs still have many limitations. As merely an example, these designs must become smaller and smaller but still provide sufficient mechanical properties to support the bonded wire structure. The pad designs often peel and lead to other quality and reliability problems. Additionally, the conventional bonding pad designs using device under pad often require an additional buffer layer that requires complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing bonding pad structures for advanced integrated circuit devices. But it would be recognized that the invention has a much broader range of applicability.

In a specific embodiment, the present invention provides an integrated circuit device. The device has a semiconductor substrate and a plurality of active MOS devices formed on the semiconductor substrate. An interlayer dielectric layer is overlying the plurality of active MOS devices. At least one single metal bonding pad is formed on the interlayer dielectric layer and directly over at least one of the active devices. A passivation layer has an opening formed over the at least single metal bonding pad. A buffer metal layer free region is formed between the plurality of active MOS devices and the at least one single metal bonding pad. The buffer metal layer free region is within an entirety of the interlayer dielectric layer. The passivation is substantially free from the buffer metal layer underlying the single metal bonding pad. Preferably, the single metal bonding pad is characterized by a square shape having four edges, where each of the edges has a cut corner region.

In an alternative specific embodiment, the present invention provides integrated circuit device comprising an improved bonding pad structure. The device has a semiconductor substrate. A plurality of active MOS devices are formed on the semiconductor substrate. The device has an interlayer dielectric layer overlying the plurality of active MOS devices and at least one single metal bonding pad formed on the interlayer dielectric layer and directly over at least one of the active devices. At least four edge regions are formed on a square shape of the at least one single metal bonding pad. An angled cut region is formed on each of the four edge regions. Preferably, the angled cut region is within a periphery of the square shape of the at least one single metal bonding pad. A passivation layer having an opening is formed over the at least single metal bonding pad. The device has a buffer metal layer free region between the plurality of active MOS devices and the at least one single metal bonding pad. The buffer metal layer free region is within an entirety of the interlayer dielectric layer. The passivation is substantially free from the buffer metal layer underlying the single metal bonding pad.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved bonding pad structure that does not peel or crack after a bonding process. Additionally, the invention provides a buffer free interlayer dielectric region, which allows for routing additional wiring layers. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing bonding pad structures for advanced integrated circuit devices. But it would be recognized that the invention has a much broader range of applicability.

Figure 1:
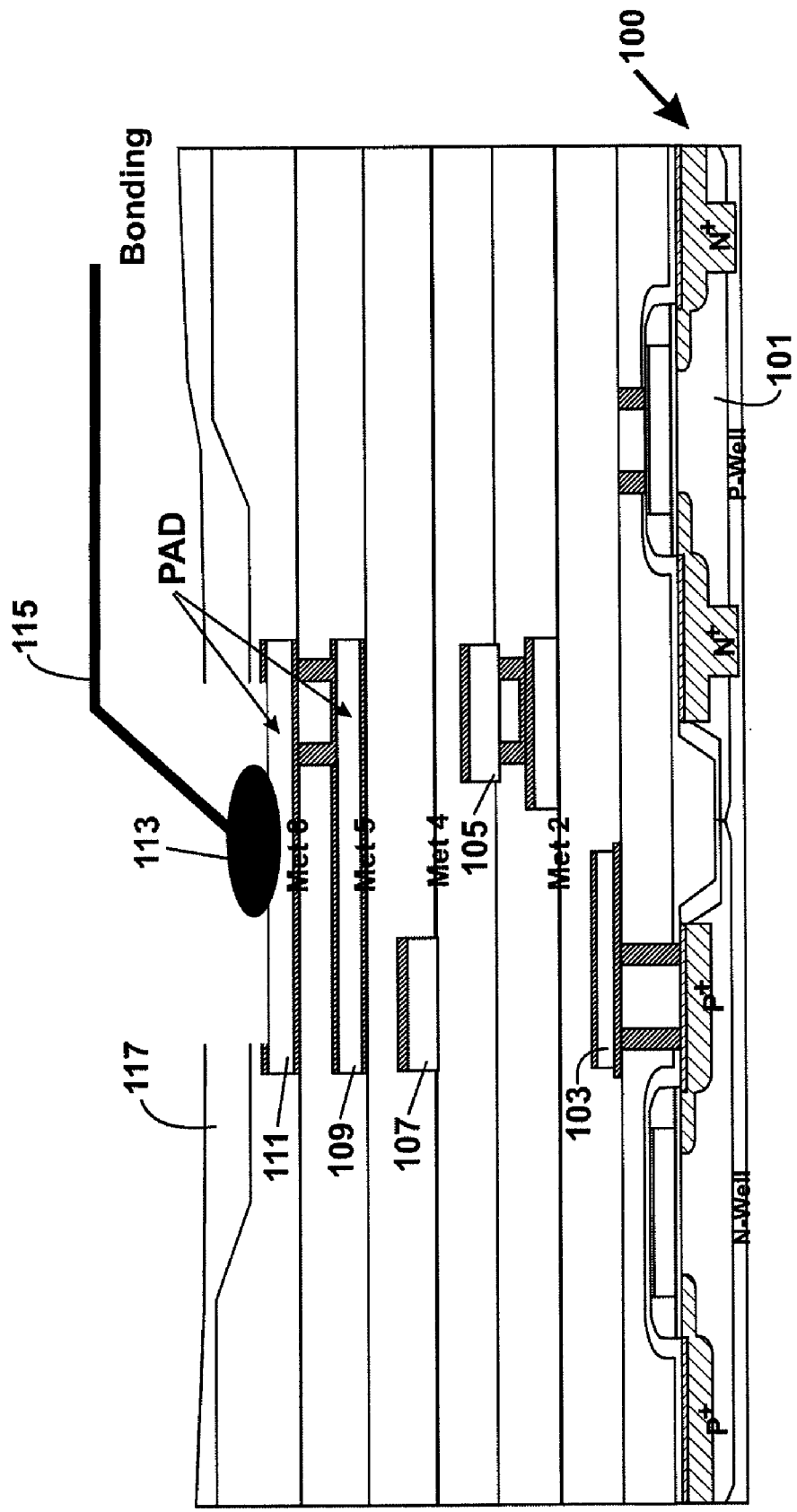
FIG. 1 is a simplified cross-sectional view diagram of a conventional bonding pad structure for a device under pad configuration.

FIG. 1 is a simplified cross-sectional view diagram 100 of a conventional bonding pad structure for device under pad configuration. As shown, the diagram 100 includes a plurality of MOS devices 101 formed on a semiconductor substrate. Preferably, the semiconductor substrate is a silicon wafer or silicon on insulator wafer or the like. The diagram includes a first patterned metal layer 103, a second patterned metal layer 105, a third patterned metal layer 107, and others. Interlayer dielectric layers are formed between each of these layers. The structure also has a buffered metal layer 109 underlying a bonding pad structure 111. The bonding pad structure includes a bond ball structure 113 bonded onto the bonding pad and connected to a bonding wire 115. A passivation 117 is formed overlying a portion of the bonding pad structure. The buffer metal layer provides mechanical support to the overlying bonding pad to prevent cracking of the interlayer dielectric layer.

Figure 2:
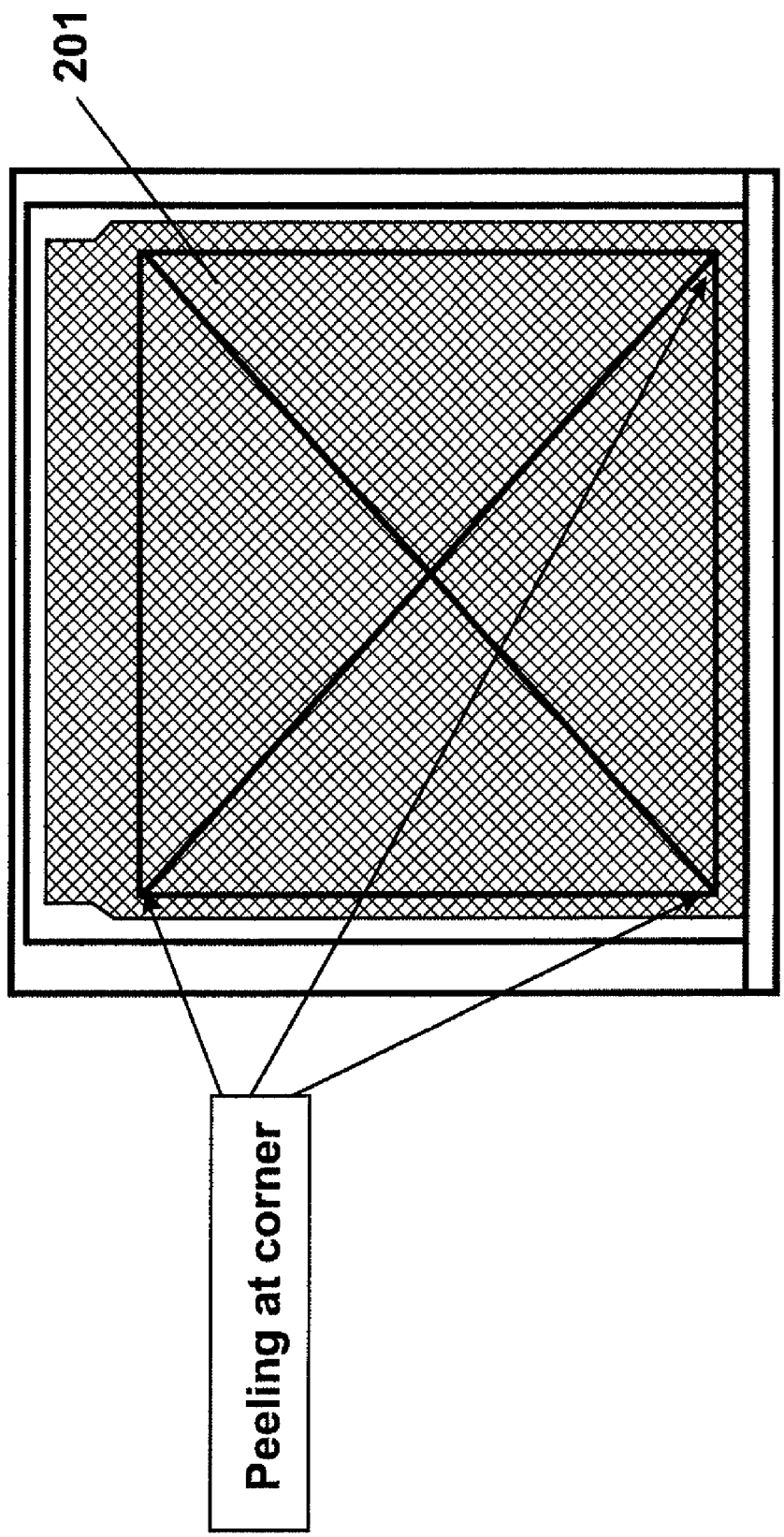
FIG. 2 is a simplified top-view diagram of a conventional bonding pad for a device under pad configuration.

FIG. 2 is a simplified top-view diagram of a conventional bonding pad for the device under pad configuration. As shown, the bonding pad structure include corner regions, which often peal and delaminate. The delamination is often caused by cracks in the interlayer dielectric from the bonding process. We discovered these limitations in conventional bonding pad structures.

Figure 3:
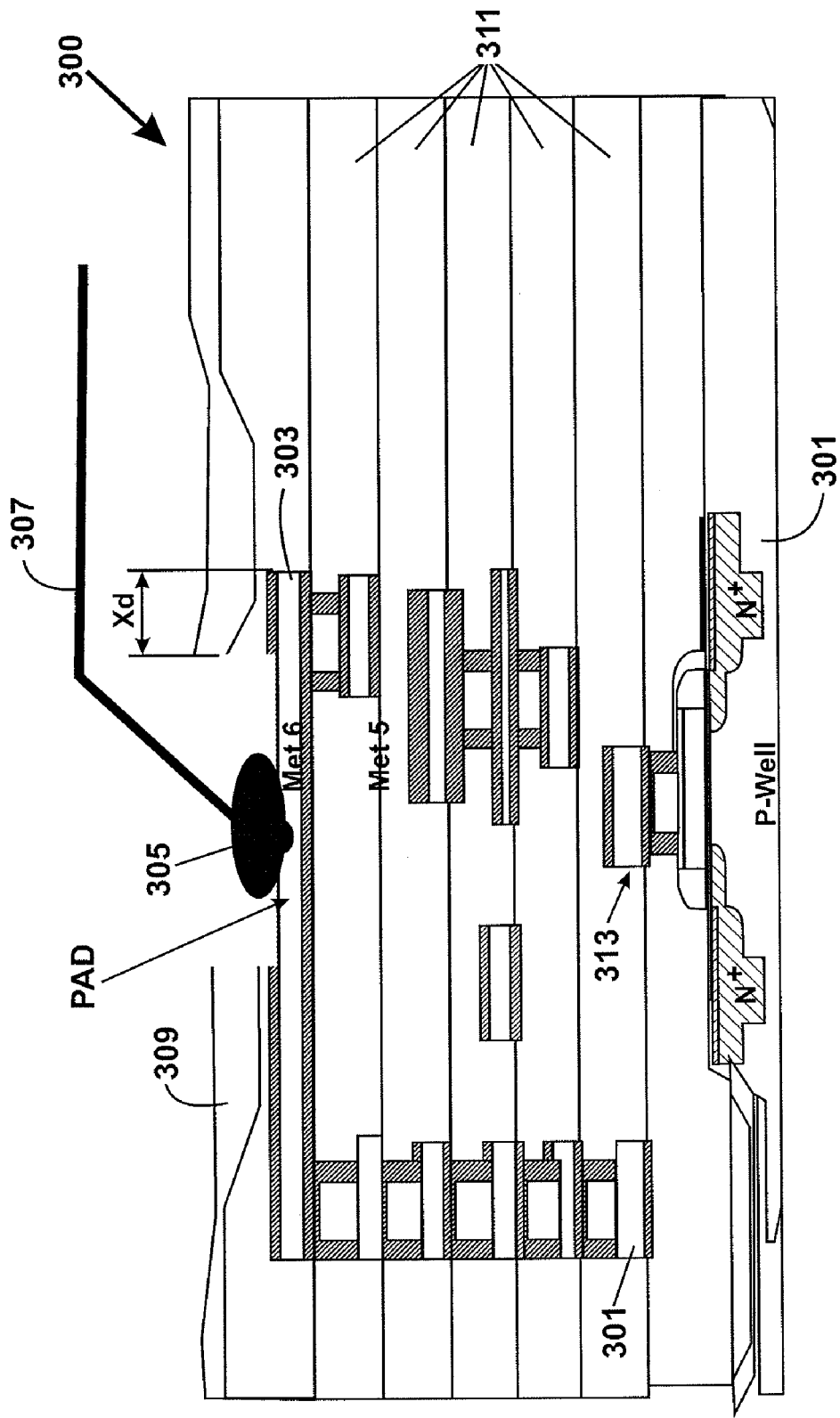
FIG. 3 is a simplified cross-sectional view diagram of a bonding pad structure for a device under pad configuration according to an embodiment of the present invention.

FIG. 3 is a simplified cross-sectional view diagram of a bonding pad structure for device under pad configuration according to an embodiment of the present invention. This diagram is merely an example, which should not unduly limit the scope of the claims herein. One of ordinary skill in the art would recognize many variations, modifications, and alternatives. As shown, the device 300 has a semiconductor substrate, e.g., silicon wafer, silicon on insulator. A plurality of active MOS devices 301 are formed on the semiconductor substrate. The device has an interlayer dielectric layer 311 (e.g., BPSG, PSG, FSG, doped oxide, APCVD) overlying the plurality of active MOS devices, e.g., 0.18 micron and less. As shown, the interlayer dielectric layer is actually multiple interlayer dielectric layers formed between metal layers 301 and others. Preferably, more than six metal layers exist. Some or all of these layers may be planarized depending upon the embodiment. Preferably, at least one single metal bonding pad 303 (e.g., aluminum) is formed on the interlayer dielectric layer and directly over at least one 313 of the active devices. A passivation layer 309 (e.g., silicon nitride over silicon oxide) having an opening is formed over the at least single metal bonding pad. The device has a buffer metal layer free region located between the plurality of active MOS devices and the at least one single metal bonding pad. The buffer metal layer free region does not have a buffer metal layer in the interlayer dielectric layer. That is, no buffer metal layer exists underlying the bonding pad according to an embodiment of the present invention. Preferably, the interlayer dielectric layer is free of a buffer metal layer underlying the entire passivation layer allowing for routing of at least one additional metal line within the interlayer dielectric layer.

Figure 4:
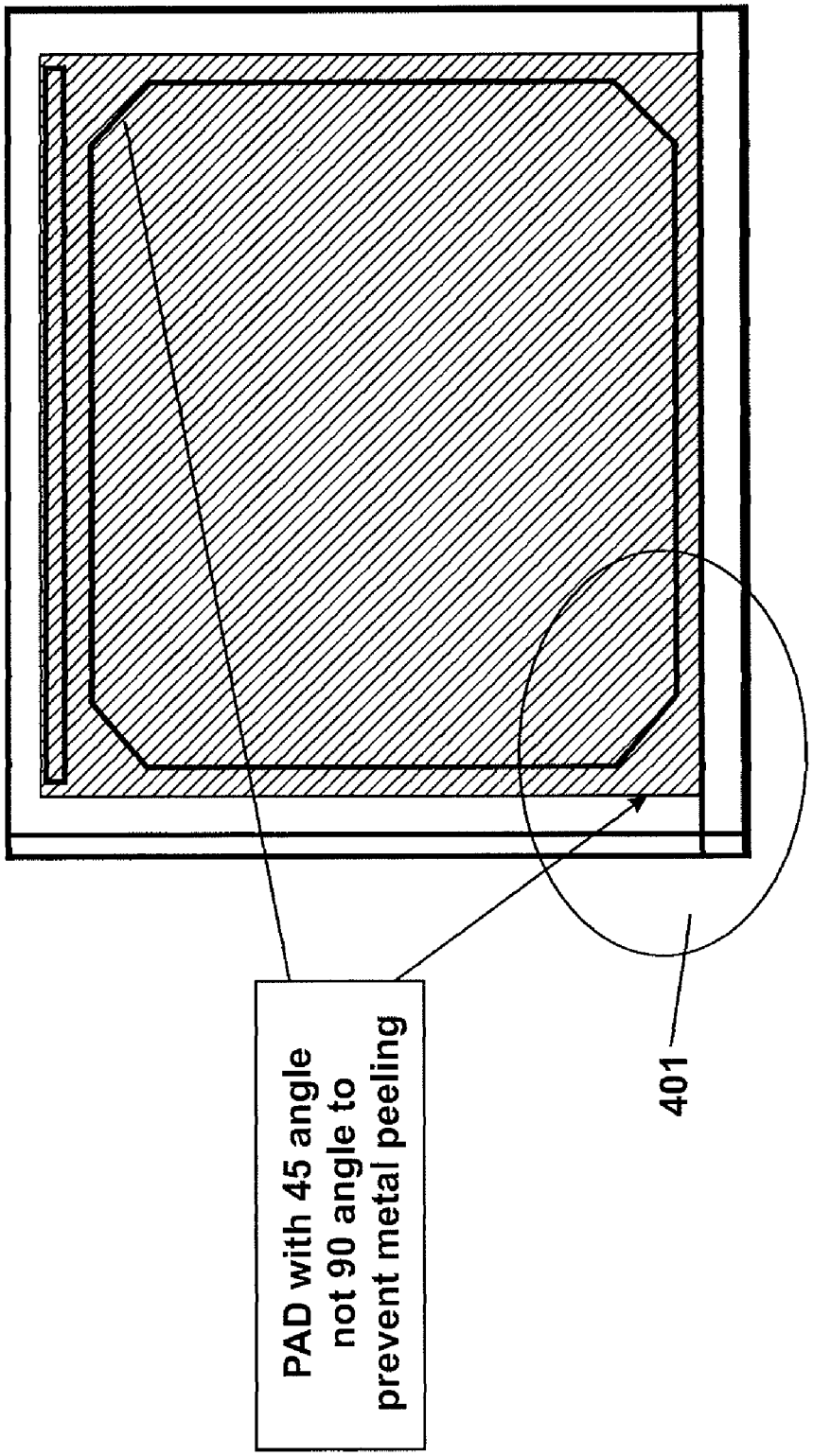
FIGS. 4 and 5 are simplified top-view diagrams of bonding pad structures according to embodiments of the present invention.
Figure 5:
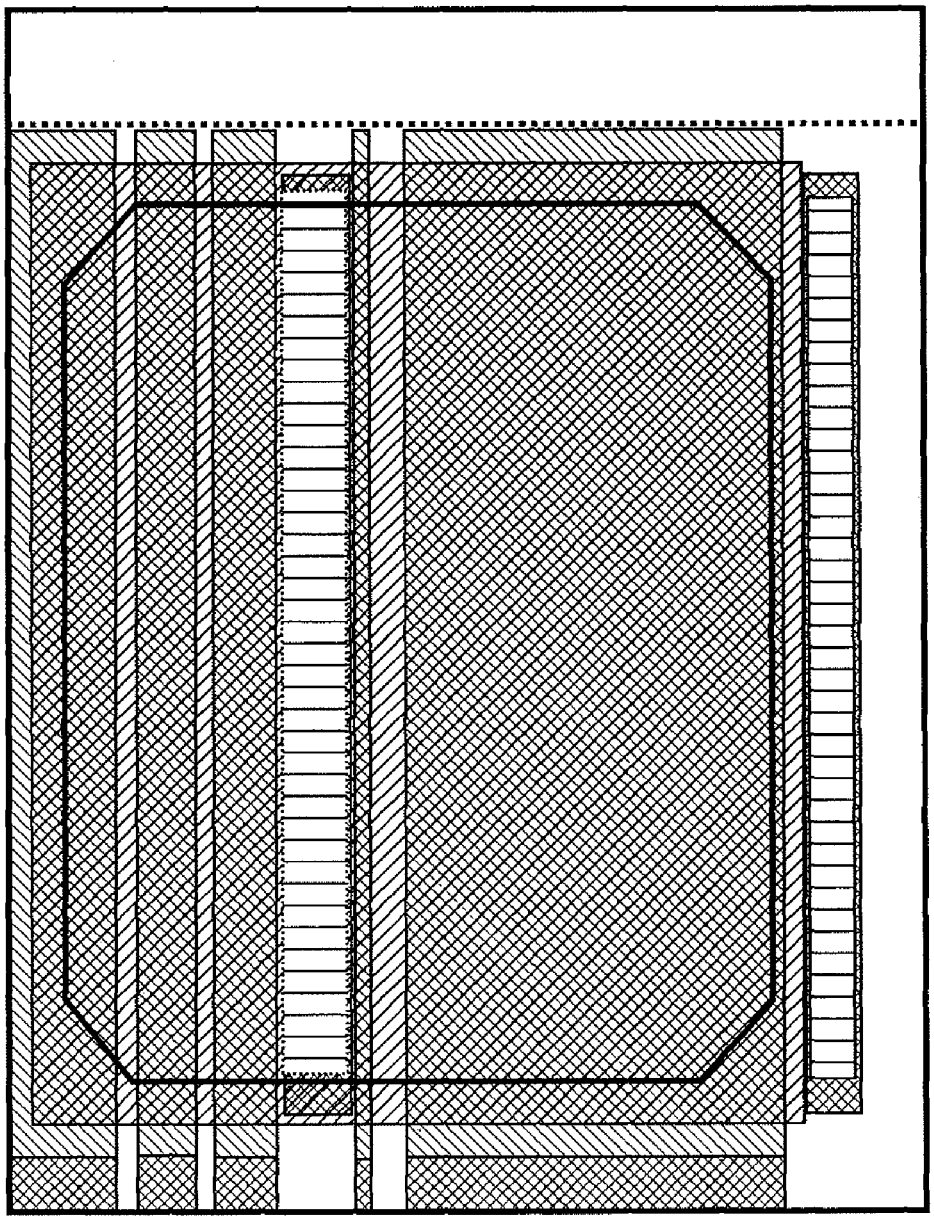

FIGS. 4 and 5 are simplified top-view diagrams of bonding pad structures according to embodiments of the present invention. These diagrams are merely examples, which should not unduly limit the scope of the claims herein. One of ordinary skill in the art would recognize many variations, modifications, and alternatives. At least four edge regions are formed on a square shape of the at least one single metal bonding pad. An angled cut region 401 is formed on each of the four edge regions. Preferably, the angled cut region is within a periphery of the square shape of the at least one single metal bonding pad. The angled cut region has a 45 degree angle and not a 90 degree angle of a square shaped bonding pad. Alternatively, the cut corner region is rounded. Depending upon the embodiment, the single metal bonding pad has a length of 50 microns and less and a thickness of 0.8 micron and less. Preferably, the single metal bonding pad comprises aluminum bearing material and the single metal bonding pad surface region comprising substantially 95% of a perfect square region.

Another example of a bonding pad structure for a device under pad is provided by FIG. 5. Details of fabricating a bonding structure can be found throughout the present specification and more particularly below.

A method for fabricating a bonding pad structure for advanced integrated circuit devices according to an embodiment of the present invention may be outlined as follows:

1. Provide substrate;
2. Form MOS transistors on the substrate;
3. Form one or more interlayer dielectric layers overlying the MOS transistors;
4. Form one or more metal interconnect layers overlying the MOS transistors;
5. Maintain the one or more interlayer dielectric layers free from a buffer metal layer;
6. Form a bonding pad overlying the interlayer dielectric layer and directly overlying at least one MOS transistor;
7. Form a passivation layer overlying the bonding pad;
8. Form an opening within the passivation layer to expose a portion of the bonding pad;
9. Bond wire to the bonding pad structure while preventing a crack in the interlayer dielectric layer; and
10. Perform other steps, as desired.

The above sequence of steps provides a method according to an embodiment of the present invention. As shown, the method uses a combination of steps including a way of forming a bonding pad structure for a device under pad configuration for a dynamic random access memory device. As merely an example, wire bonding parameter setting range include Power: 90~100 mA; Force: 10~25 g; and Time: 10~15 ms. according to a specific embodiment. These parameters have been carried out using the equipment parameters below.

TABLE 1

| | |
|---|---|
| Wire Bonder | K&S 8028PPS |
| Wire Pull & Bond Strength Tester | Dage4000 |
| Gold Wire | 99.99% Au |

Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device comprising:
a semiconductor substrate;
a plurality of active MOS devices formed on the semiconductor substrate;
an interlayer dielectric layer overlying the plurality of active MOS devices;
at least six patterned metal layers formed within the interlayer dielectric layer;
at least one single metal bonding pad formed in a top patterned metal layer and located directly over at least one of the active MOS devices, the metal bonding pad being coupled to one or more patterned metal layers thereunder; and
a passivation layer having an opening formed over the at least one single metal bonding pad; and
a buffer-metal-layer free region disposed between the plurality of active MOS devices and the at least one single metal bonding pad, the buffer-metal-layer free region being free of a buffer-metal-layer within the interlayer dielectric layer cracks directly below a bonding area; and
wherein the interlayer dielectric layer is substantially free of.

2. The device of claim 1 wherein the single metal bonding pad is characterized by a square shape having four edges, each of the edges having a cut corner region.

3. The device of claim 2 wherein the cut corner region is rounded.

4. The device of claim 3 wherein the cut corner region is angled.

5. The device of claim 1 wherein the single metal bonding pad has a length of 50 microns and less.

6. The device of claim 1 wherein the single metal bonding pad is connected to the bond wire using at least a power ranging from about 90 mA to about 100 mA, a force ranging from about 10 g to about 20 g, and for a time ranging from about 10 ms to about 15 ms.

7. The device of claim 1 wherein the at least one single metal bonding pad has a thickness of 0.8 micron and less.

8. The device of claim 1 wherein the at least one single metal bonding pad comprises aluminum bearing material.

9. The device of claim 1 wherein the at least one single metal bonding pad is characterized by a square shape having four cut corner regions, the single metal bonding pad comprising substantially 95% of a perfect square region.

10. The device of claim 1 wherein the interlayer dielectric layer being free from the buffer metal layer within the entirety of the interlayer dielectric layer allows for routing of at least one additional metal line within the interlayer dielectric layer.

11. An integrated circuit device comprising:
a semiconductor substrate;
a plurality of active MOS devices formed on the semiconductor substrate;
an interlayer dielectric layer overlying the plurality of active MOS devices;
at least one single metal bonding pad formed on the interlayer dielectric layer and directly over at least one of the active MOS devices, the metal bonding pad being coupled to one or more patterned metal layers thereunder;
at least four edge regions formed on a square shape of the at least one single metal bonding pad;
an angled cut region formed on each of the four edge regions, the angled cut region being within a periphery of the square shape of the at least one single metal bonding pad;
a passivation layer having an opening formed over the at least one single metal bonding pad; and
a buffer-metal-layer free region between the plurality of active MOS devices and the at least one single metal bonding pad, the buffer-metal-layer free region being free of a buffer-metal-layer within the interlayer dielectric layer directly below a bonding area of the bonding pad; and
two or more wiring layers directly under the bonding area.

12. The device of claim 11 wherein the single metal bonding pad has a length of 50 microns and less.

13. The device of claim 11 wherein the single metal bonding pad is further connected to a bond wire while preventing a crack in the interlayer dielectric layer.

14. The device of claim 11 wherein the single metal bonding pad is connected to the bond wire using at least a power ranging from about 90 mA to about 100 mA, a force ranging from about 10 g to about 20 g, and for a time ranging from about 10 ms to about 15 ms..

15. The device of claim 11 wherein the at least one single metal bonding pad has a thickness of 0.8 micron and less.

16. The device of claim 11 wherein the at least one single metal bonding pad comprises aluminum bearing material.

17. An integrated circuit device comprising:
a semiconductor substrate;
a plurality of active MOS devices formed on the semiconductor substrate:
an interlayer dielectric layer overlying the plurality of active MOS devices;
at least three patterned metal layers formed within the interlayer dielectric layer;
at least one single metal bonding pad formed on the interlayer dielectric layer and directly over the plurality of active devices, the metal bonding pad being coupled to one or more patterned metal layers thereunder;
a passivation layer having an opening formed over the at least single metal bonding pad; and
a buffer-metal-layer free region between the plurality of active MOS devices and the at least one single metal bonding pad, the buffer-metal-layer free region being free of a buffer-metal-layer within the interlayer dielectric layer directly below a bonding area; and
two or more wiring layers directly under the at least one single metal bonding pad.

18. An integrated circuit device comprising:
a semiconductor substrate;
a plurality of active MOS devices formed on the semiconductor substrate;
an interlayer dielectric layer overlying the plurality of active MOS devices;
at least three patterned metal layers formed within the interlayer dielectric layer;
at least one single metal bonding pad formed on the interlayer dielectric layer and directly over at least one of the active devices, the metal bonding pad being coupled to one or more patterned metal layers thereunder; and a passivation layer having an opening formed over the at least single metal bonding pad;

wherein the interlayer dielectric layer is substantially free of a buffer-metal-layer directly below a bonding area of the metal bonding pad; and an interconnect layer disposed in a patterned metal layer immediately under the at least one single metal bonding pad.

* * * * *